United States Patent
Chang

(10) Patent No.: US 6,529,405 B2
(45) Date of Patent: Mar. 4, 2003

(54) CIRCUIT AND METHOD FOR PROGRAMMING AND READING MULTI-LEVEL FLASH MEMORY

(75) Inventor: Seung Ho Chang, Choongcheongbuk-Do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 10/029,034

(22) Filed: Dec. 28, 2001

(65) Prior Publication Data

US 2002/0085436 A1 Jul. 4, 2002

(30) Foreign Application Priority Data

Dec. 30, 2000 (KR) .............................................. 00-87293

(51) Int. Cl.⁷ ............................................... G11C 16/04
(52) U.S. Cl. ............................ 365/185.03; 365/185.21; 365/185.33
(58) Field of Search ....................... 365/185.03, 185.21, 365/185.33, 185.2, 189.07, 189.11, 189.12, 207

(56) References Cited

U.S. PATENT DOCUMENTS

| 5,172,338 A | 12/1992 | Mehrotra et al. |
| 5,717,632 A | 2/1998 | Richart et al. |
| 6,297,988 B1 * | 10/2001 | Parker et al. ............... 365/168 |

* cited by examiner

*Primary Examiner*—David Lam
(74) *Attorney, Agent, or Firm*—Birch, Stewart, Kolasch & Birch, LLP

(57) ABSTRACT

In a multi-level flash memory including a plurality of flash memory cells having $2^{n+m}$ levels represented by upper n bits and lower m bits, a device for programming or reading the flash memory, comprising: an upper bit reference cell block for supplying reference cell currents to construct n upper bits in (n+m) bits for representing multi-levels of a selected memory cell, a lower bit reference cell block supplying reference currents for constructing m lower bits in the (n+m) bits for representing multi-levels of the selected memory cel, and a memory cell program/read unit for reading or programming levels of the selected memory cell by comparing a first voltage of the selected memory cell to the reference currents.

21 Claims, 5 Drawing Sheets

CIRCUIT AND METHOD FOR PROGRAMMING AND READING MULTI-LEVEL FLASH MEMORY

RELATED APPLICATION

The present application claims the benefit of Korean Patent Application No. 87293/2000 filed Dec. 30, 2000, which is herein fully incorporated by reference.

BACKGROUND OF THE INVENTION

1. Field of the Invention

The present invention relates to a circuit and method for programming and reading a multi-level flash memory, which provide sufficient intervals between threshold voltage distributions and improve the level sensing speed of the flash memory.

2. Discussion of the Related Art

A non-volatile memory maintains its stored data even when its power source disappears. EPPROM or EEPROM is a non-volatile memory that does not require a refresh operation, as compared to SRAMs. EEPROM that erases data stored in its memory cells by block units, instead of byte units, is known as a flash memory.

A conventional flash memory includes a plurality of memory cells for storing data. Each memory cell generally includes a transistor having a floating gate. To store data in the memory cells of a flash memory, i.e., to program the flash memory, certain amounts of electrons are injected into the floating gates of the memory cells to set the threshold levels of the memory cells to desired levels. Different threshold levels set in the memory cells represent different data. Generally, the threshold levels of the memory cells are detected and compared with predetermined reference levels provided by reference cells, so as to determine the different levels of the memory cells. For instance, in a memory cell having two levels (i.e., it stores one-bit information), If the memory cell has a first threshold level, it may represent a storage of "0" for the one bit, whereas if the memory cell has a second threshold level, it may represent a storage of "1" for the bit. In this manner, each memory cell of the flash memory can store multiple levels corresponding to multiple bit information.

To erase the flash memory, the electrons injected in the floating gates are extracted from the floating gates to reduce the threshold voltages of the cell transistors to desired levels.

There exist different conventional methods for programming and reading a flash memory. For example, the EEPROM flash memory can be programmed by repeating short durations of programming and verifying operations until the desired threshold levels have been set for the memory cells. In another example, the flash memory can be programmed by applying a long program pulse to the memory cells until the memory cells are programmed with the desired threshold levels and then releasing all programming conditions once the memory cells are programmed.

A method of reading a multi-level flash memory according to a related art, involves applying one fixed voltage to the control gates of memory cells and reference cells and simultaneously comparing the threshold voltage of the memory cells with different reference voltages using a sensing amplifier. Here, the sensing amplifier includes an X number of comparators wherein X=[(the number of levels)−1]. The comparators are used to determine the levels of the memory cells.

FIG. 1A is a diagram of a related art circuit in which the above-described method of reading the flash memory can be implemented. As shown, this circuit is constructed with a memory cell 10 for storing two-bit data (four levels), a drain bias unit 12 for supplying a drain of the memory cell 10 with a power source voltage Vdd, a reference cell block 14 for producing three kinds of reference currents ref1, ref2, and ref3, three comparators 16, 18, and 20 for comparing respectively the reference currents ref1, ref2, and ref3 to the drain current of the memory cell 10, and a decoding unit 22 for outputting 2-bit data made of MSB (most significant bit) and LSB (least significant bit) by decoding outputs X1, X2, and X3 of the comparators 16, 18, and 20 according to known techniques.

In the circuit of FIG. 1A, a fixed voltage is applied to the control gates of the memory cell 10 and reference cells in the reference cell block 14. As a result, a drain current or cell current "Icell" of the memory cell 10 is applied to the comparators 16, 18 and 20, and at the same time, the reference currents ref1, ref2, and ref3 having different ranges are applied simultaneously to the comparators 16, 18, and 20, respectively. The comparators 16, 18, and 20 compare the cell current Icell with the corresponding reference current to output comparison results X1, X2 and X3. The decoding unit 22 outputs MSB and LSB (2 bit/four levels) in accordance with the comparison results X1, X2, and X3. For example, if the comparison results indicate that the cell current Icell of the memory cell 10 is at a level 4, then the decoding unit 22 may output (1, 1) as MSB and LSB.

FIG. 1B is a graph showing threshold voltage distributions of the circuit of FIG. 1A according to a related art. As shown in FIG. 1B, the memory cell 10 can store two-bits (MSB and LSB) of information. That is, the memory cell 10 has four possible levels (0,0), (0,1), (1,0) and (1,1), which are detected by using the reference currents ref1, ref2 and ref3. The reference currents ref1, ref2, and ref3 are distributed in accordance with a distribution size of a threshold voltage Vt of the memory cell 10, so as to fall between two of the possible threshold voltage distributions of the circuit.

Despite the advantage that a particular level of a multi-level memory cell can be sensed by a single operation using the multiple comparators 16, 18 and 20, the circuit of FIG. 1A suffers from the following problems. In the circuit of FIG. 1A, a large number of voltage distributions must be made within a limited voltage range or threshold voltage window. For example, as shown in FIGS. 1B and 1C, a four-level (2 bit) flash memory requires four different threshold voltage distributions for the memory cell, and three different reference currents/voltages therebetween, a total of seven voltage distributions within an allotted threshold voltage window. In another example, a 4-bit flash memory requires 16 threshold voltage distributions for the memory cells and 15 reference current cells/voltages, a total of thirty-one (31) voltage distributions within an allotted threshold voltage window. This crowds the voltage threshold window and causes errors in level detections. Particularly, as the number of bits representing the respective levels of the flash memory increases, this decreases significantly a margin for establishing the threshold voltage distributions within the threshold voltage window, rendering the problem much more serious for high-bit flash memories. In this regard, it becomes extremely difficult and ineffective to use the above-described conventional method to read a memory cell stored with over 3 bits of information.

FIG. 2A is a diagram of a circuit for programming and reading a multi-level flash memory according to another related art and FIG. 2B shows an example of a graph of threshold voltage distributions for the circuit of FIG. 2A. As shown, this circuit is constructed with a memory cell 30 for storing data, a drain bias unit 32 for supplying a drain of the memory cell 30 with a power source voltage Vdd, a reference cell block 34 for producing a reference voltage Vref, a single comparator 36 for comparing the reference voltage Vref to a drain voltage of the memory cell 30, and a decoding unit 38 for outputting two bits MSB and LSB of data by decoding an output X4 of the comparator 36.

In the circuit of FIG. 2A, a voltage Vgs is applied to the control gates of the memory cell 30 and a reference cell of the reference cell block 34, wherein the voltage Vgs is increased (or decreased) sequentially by three steps to voltage V1, V2, and then V3, as shown in FIG. 2C. As a result, the reference voltage Vref of varying range is applied one at a time to the comparator 36 depending on the voltage Vgs, and a drain voltage Vcell of the memory cell 30 corresponding to the drain current Icell of the memory cell 30 is also applied to the comparator 36. The comparator 36 compares the drain voltage Vell with the reference voltage Vref, and the decoding unit 38 outputs MSB and LSB in accordance with an output of the comparator 36.

Although the circuit of FIG. 2A may allow multi-level sensing using only one sense amplifier and one reference cell, the sensing speed of this circuit is slow and the circuit may require additional components to complete its operation. For example, sensing different levels of 2-bit memory cell, 3-bit memory cell, and 4-bit memory requires that a control voltage Vgs applied to the memory cell be stepped through at least 3, 7 and 15 different voltages, respectively. Thus, the circuit and method of FIG. 2A require at least [(number of level)−1] voltage variance steps, wherein a total number of voltage variance steps required for the memory cell increases $2^n$ times as the number of bits allotted to the memory cell. This causes a serious problem of slowing down the level sensing speed of the circuit.

The above-described and other conventional techniques for programming and reading a flash memory are disclosed in U.S. Pat. No. 5,172,338 and U.S. Pat. No. 5,717,632, each of which is herein fully incorporated by reference.

Therefore, a need exists for an improved circuit and method for programming and reading a multi-level flash memory, which overcome problems associated with conventional circuits and methods.

SUMMARY OF THE INVENTION

Accordingly, the present invention is directed to a circuit and method for programming and reading a multi-level flash memory that substantially obviate one or more problems due to limitations and disadvantages of the related art.

An object of the present invention is to provide a circuit and method for programming and reading a multi-level flash memory that provide sufficient intervals between threshold voltage distributions and improve the level sensing speed of the memory.

Another object of the present invention is to provide a circuit and method for programming and reading a multi-level flash memory, i.e. having a plurality of levels represented by k bit(s) (k=n+m) where n and m are respectively upper and lower numbers of bits, by programming and distributing threshold voltages of memory and reference current cells, constructing n upper bits using a sense amplifier having [(level number)−1] comparison circuits to distinguish the respective levels and a constant control gate voltage, and constructing m lower bits by varying a control gate voltage with a sense amplifier having one comparison circuit enabling to judge two levels represented by 1 bit.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a flash memory including a plurality of flash memory cells having $2^{n+m}$ levels represented by upper n bits and lower m bits, a circuit for programming and reading the flash memory according to an embodiment of the present invention, comprises an upper bit reference cell block for supplying reference cell currents for constructing n upper bits in total (n+m) bits for representing multi-levels of the memory cell, a lower bit reference cell block for supplying reference currents for constructing m lower bits in the total (n+m) bits for representing multi-levels of the memory cell, a cell gate voltage supplying unit for supplying each control gate of the memory cells with a voltage, a memory cell program/read unit for reading or programming levels of the memory cell by comparing a drain voltage of the memory cell to the reference current, and a data register for storing an output data of the memory cell program/read unit or supplying the memory cell program/read unit with the stored data.

In another aspect of the present invention, in a flash memory including a plurality of flash memory cells having $2^{n+m}$ levels represented by upper n bits and lower m bits, a method of programming and reading a flash memory with multiple levels, includes the steps of programming reference currents so as to supply ($2^n-1$) reference current cells with threshold voltages having a predetermined interval each other wherein the reference current cells are taken as references for distinguishing the upper n bits, programming reference currents so as to supply $2^n$ reference current cells with threshold voltages having a predetermined interval each other when the reference current cells are taken as references for distinguishing the lower m bits, programming a threshold voltage of the memory cell so as to be allocated to one of the $2^{n+m}$ threshold voltages, sensing the upper n bits through one step and storing the upper n bits in a data register using ($2^n-1$) comparison circuits for comparing currents from the ($2^n-1$) upper bit reference current cells to a drain current of the memory cell, and sensing the upper n bits by varying a voltage applied to a control gate of the memory cell through ($2^m-1$) steps using ($2^n-1$) comparison circuits for comparing currents from the ($2^n-1$) upper bit reference current cells to the drain current of the memory cell and storing the sensed lower m bits in the data register.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
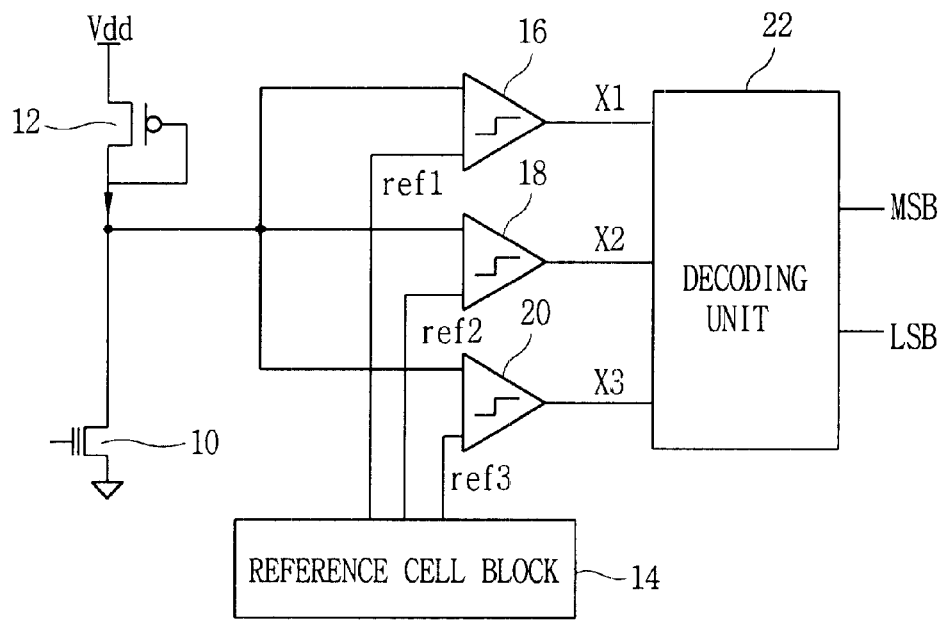
FIG. 1A illustrates a diagram of a circuit having three reference current cells for programming and reading a multi-level flash memory according to a related art.
Figure 1B:
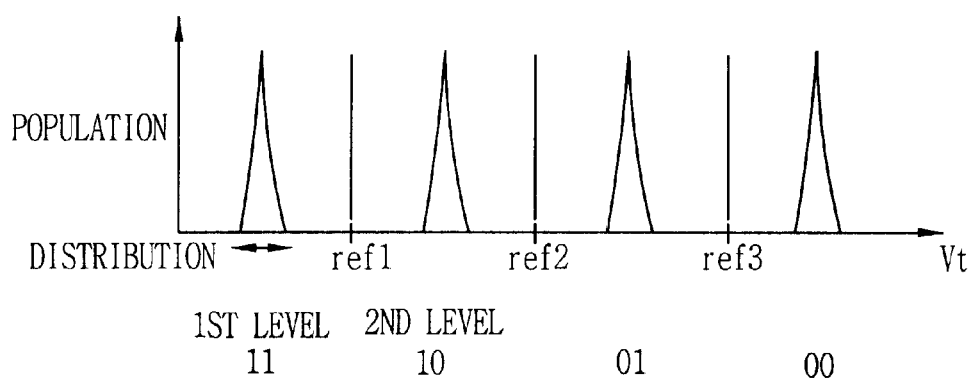
FIG. 1B illustrates a graph of threshold voltage distributions and reference current distributions for the circuit of FIG. 1A.
Figure 1C:
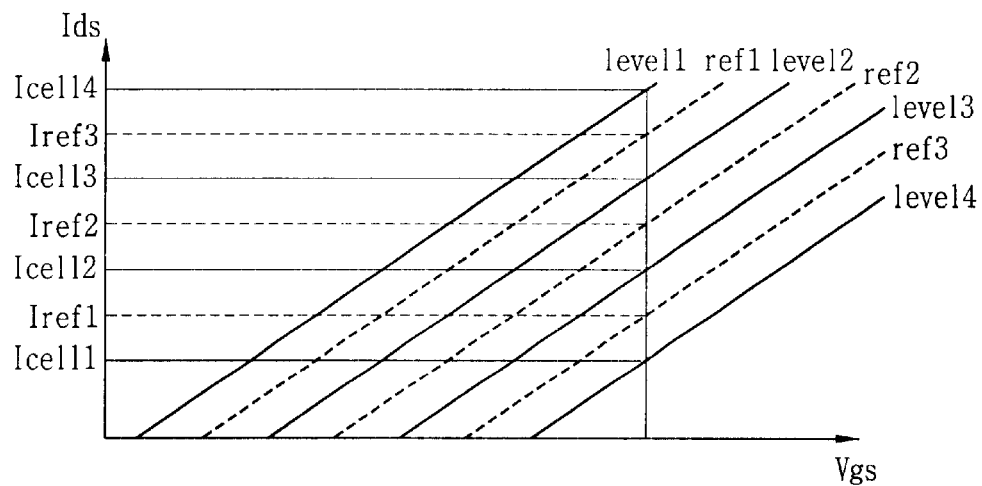
FIG. 1C illustrates a characteristic graph showing a relationship between gate voltages and reference currents for the circuit of FIG. 1A.
Figure 2A:
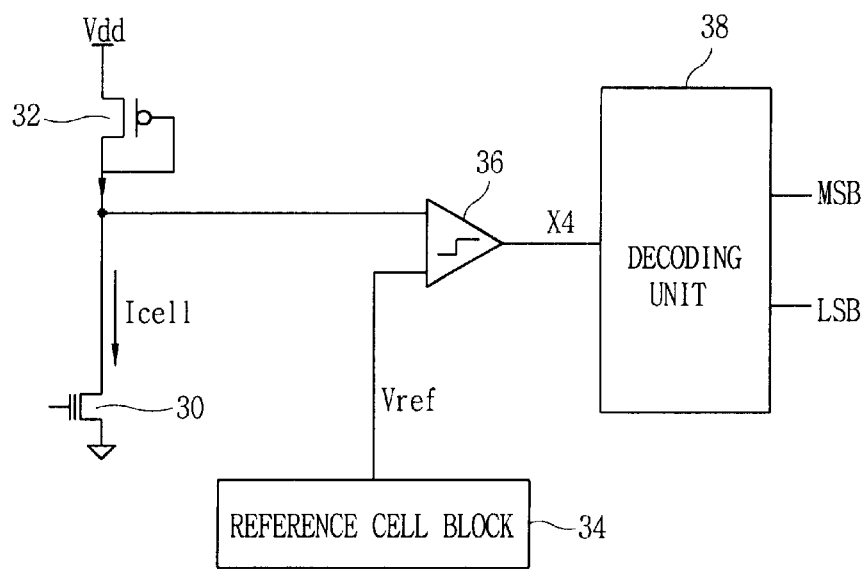
FIG. 2A illustrates a diagram of a circuit for programming and reading a multi-level flash memory according to another related art.
Figure 2B:
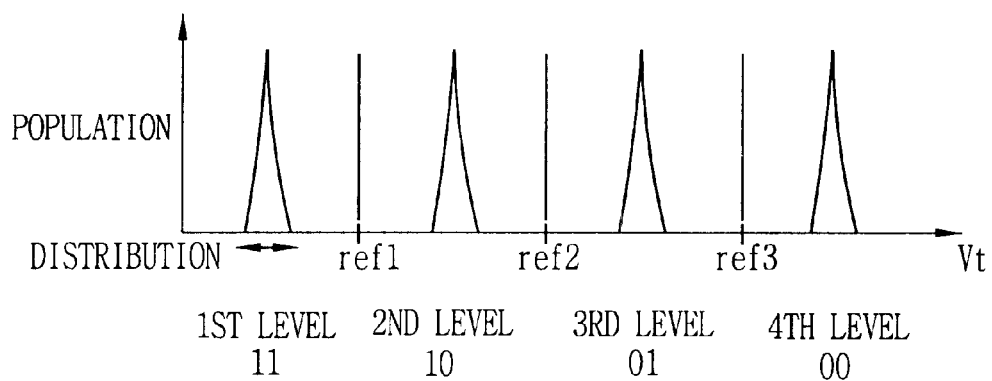
FIG. 2B illustrates a graph of threshold voltage distributions and reference current distributions for the circuit of FIG. 2A.
Figure 2C:
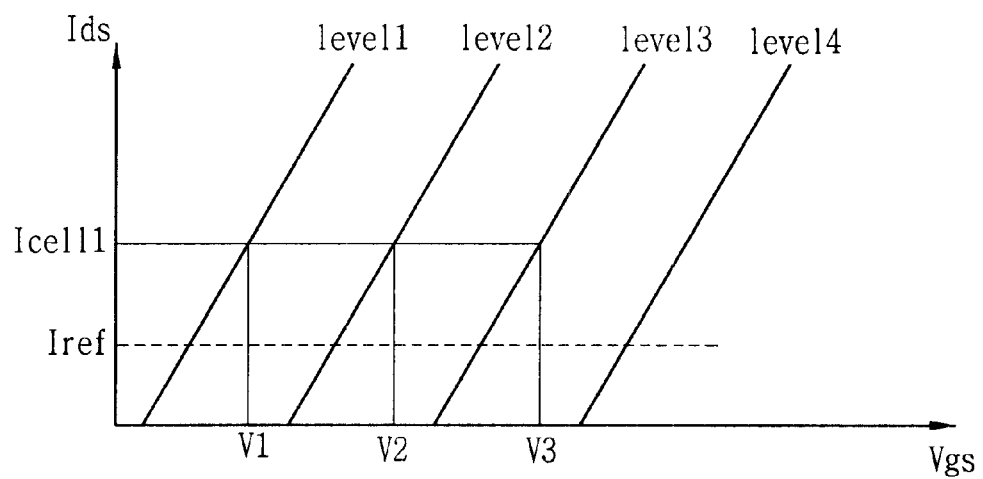
FIG. 2C illustrates a characteristic graph showing a relationship between gate voltages and reference currents for the circuit of FIG. 2A.
Figure 3:
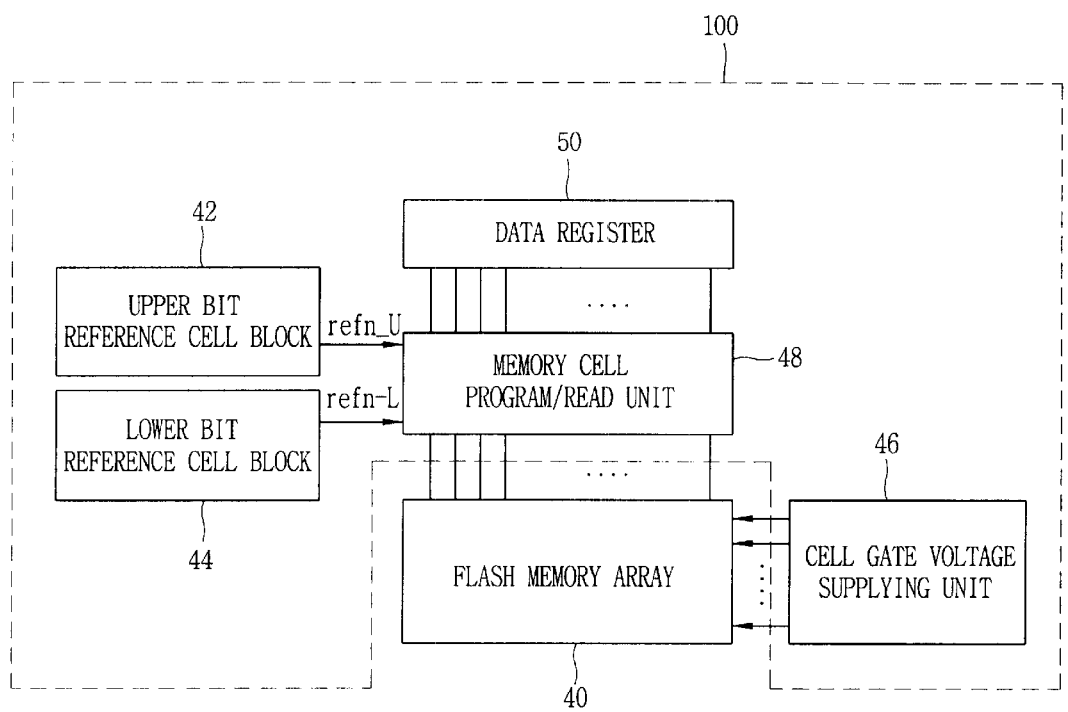
FIG. 3 illustrates a block diagram of a circuit for programming and reading a multi-level flash memory according to one embodiment of the present invention.

FIG. 3 illustrates a block diagram of a circuit 100 for programming and reading a multi-level flash memory array 40 according to one embodiment of the present invention. As shown in FIG. 3, this circuit 100 is operatively coupled with the flash memory array 40 including memory cells having multi-levels, and includes an upper bit reference cell block 42 for supplying reference cell current(s) to produce upper "n" bits, a lower bit reference cell block 44 for supplying reference current(s) to produce lower "m" bits, a cell gate voltage supplying unit 46 for selectively supplying voltages to the control gates of the memory cells of the array 40, a memory cell program/read unit 48 for selectively reading or programming levels of the memory cells by comparing the drain voltages of the memory cells to the reference current (s), and a data register 50 for storing an output data of the memory cell program/read unit 48 or supplying the memory cell program/read unit 48 with the stored data. All these components are operatively coupled, and can be implemented using existing components. For example, each of the upper and lower bit reference cell blocks 42 and 44 may include at least one reference cell having a transistor.

Figure 4:
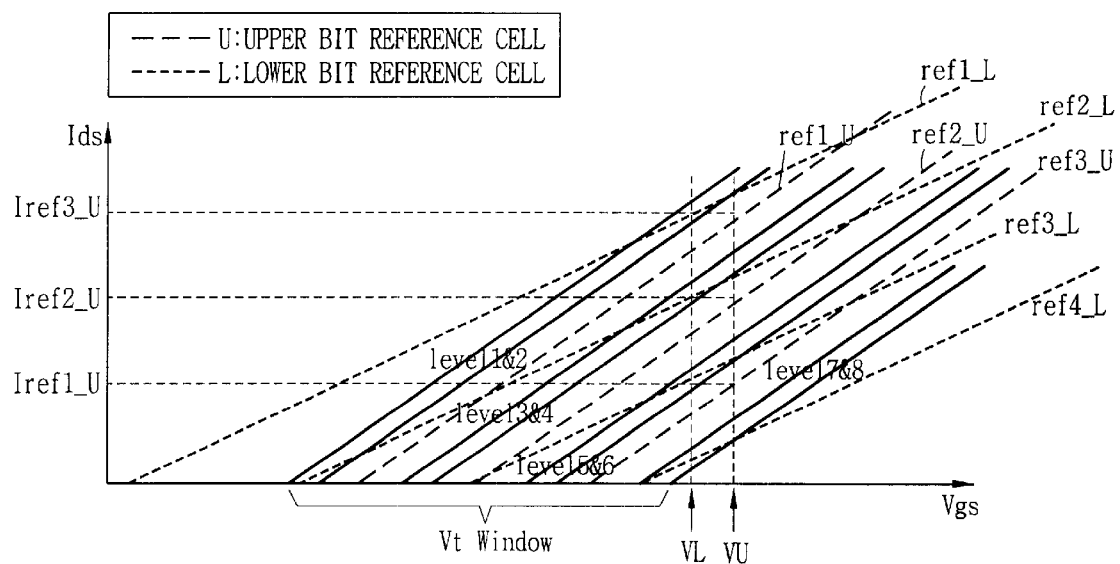
FIGS. 4 and 5 illustrate examples of graphs showing a relationship between reference currents and gate voltages of respective reference current cells for the circuit of FIG. 3 according to one embodiment of the present invention.
Figure 5:
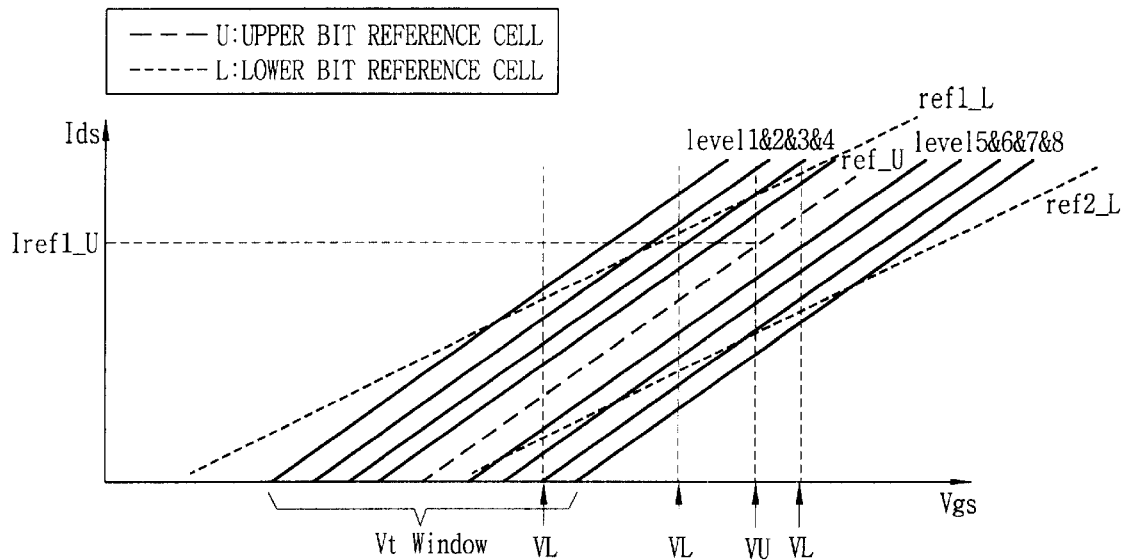

FIGS. 4 and 5 illustrate examples of a graph showing a relationship between a control voltage Vgs and a drain current Ids for the circuit of FIG. 3 where a 3-bit memory cell is involved. "Ids" and "Vgs" represent a drain current of a memory cell and a voltage applied to the control gate of that memory cell, respectively. "VU" and "VL" are gate voltages for sensing upper and lower bits, respectively. Referring to FIGS. 3–5, the operation of programming a memory cell such a 3-bit memory cell will be explained.

As shown in FIGS. 3 and 4, the upper bit reference cell block 42 generates and applies simultaneously upper reference currents ref1_U, ref2_U, and ref3_U (ref1_U . . . refn_U)to the memory cell program/read unit 48. Similarly, the lower bit reference cell block 44 generates and applies simultaneously lower reference currents ref1_L, ref2_L, and ref3_L (ref1_L . . . refn_L) to the memory cell program/read unit 48. In order to produce the upper bit reference currents ref1_U, ref2_U, and ref3_U and lower bit reference currents ref1_L, ref2_L, and ref3_L which are distributed as shown in FIGS. 4 and 5, threshold voltages of the respective reference current cells included in the upper and lower reference cell blocks 42 and 44 are pre-established. The cell gate voltage supply unit 46 drives selectively the memory cells in the flash memory array 40.

The memory cell program/read unit 48 compares the upper reference currents ref1_U, ref2_U, and ref3_U simultaneously with the drain current Ids of the selected memory cell in the array 40, thereby judging the level of the memory cell for the upper n bits. The memory cell program/read unit 48 also compares the lower reference currents ref1_L, re_L, and ref3_L simultaneously with the drain current Ids of the selected memory cell to judge the level of the memory cell for the lower m bits. Then the memory cell program read unit 48 combines the upper and lower bit information to produce multi-bit data (i.e., 3-bit data), and stores the multi-bit data in the data register 50.

In the present invention, the reference cells of the upper bit reference cell block 42 generate reference currents for distinguishing the n upper bits. A 'drain current vs. gate voltage' characteristic of the upper bit reference cell has the same slope (Gm=ΔIds/ΔVgs) as the 'drain current vs. gate voltage' characteristic of the memory cell. In comparison, the reference cells of the lower bit reference cell block 44 generate reference currents for distinguishing the lower m bits. A 'drain current vs. gate voltage' characteristic of the lower bit reference cell, however, has a slope less steep than the slope of the 'drain current vs. gate voltage' characteristic (Gm=ΔIds/ΔVgs) of the memory cell.

In this manner, the respective levels of the memory cells are read simultaneously by establishing a slope of the graph of the reference current cell to be lower than that of the related art, and the one lower bit is read by one step and a single voltage of the control gate. Moreover, using eight memory cell characteristic curves and seven reference current cell characteristic curves, for example, the present invention makes it possible to sense eight different levels of the memory cells by a single step. Also, the threshold voltage distributions of the memory cells of the present invention have sufficient intervals. As a result, the level sensing speed of the circuit is increased significantly and the level sensing operation occurs without error. In the above example, the four reference current cells for the lower bits are programmed regardless of the threshold voltage distribution intervals of the memory cell and the reference current cell for the upper bits, thereby causing no effect on securing sufficient intervals between the threshold voltage distributions.

In another example where 3-bits of data are involved, as shown in FIGS. 3 and 5, the upper reference cell block 42 generates and applies an upper bit reference current ref1_U to the memory cell program/read unit 48. The lower bit reference cell block 44 generates and applies lower bit reference currents ref1_L and ref2_L to the memory cell program/read unit 48. The cell gate voltage supply unit 46 drives the respective memory cells of the flash memory array 40.

Subsequently, the memory cell program/read unit 48 compares the upper reference current ref1_U to the drain current Ids of the selected memory cell(s), thereby judging to which group the levels of the respective memory cells belong by reading once the one upper bit of the three bits. The memory cell program/read unit 48 compares the lower reference currents ref1_L and ref2_L to the drain current Ids of the selected memory cell(s), thereby reading two lower bits of the three bits by three steps. Data of three bits having such levels of the read memory cell are stored in the data register 50 or some other means.

As shown in FIG. 5, the levels of the memory cells are read simultaneously by establishing a slope of the graph of the reference current cell to be less steep than that of the related art. The two lower bits are read by three steps using three control gate voltages. Moreover, using eight memory cell characteristic curves and three reference current cell characteristic curves, the present invention makes it possible to sense eight different levels for the upper one bit by using a single step and for the lower bits by multiple (three) steps. Thus, the distributions of the threshold voltages of the respective memory cells are secured sufficiently, and the sensing speed of the circuit is increased significantly.

According to the present invention, a flash memory of 16 levels represented by 4 bits can be programmed and/or read with improved level sensing speed.

In this manner, the present invention programs and reads a flash memory having multi-levels represented by k bit(s) (k=n+m) where n and m are upper and lower numbers of bits, respectively, by programming and distributing threshold voltages of memory and reference current cells, constructing n upper bits using a sense amplifier having [(level number)−1] comparison circuits to distinguish the respective levels and a constant control gate voltage, and constructing m lower bits by varying a control gate voltage with a sense amplifier having one comparison circuit to judge two levels represented by 1 bit. Thus, the distributions of the threshold voltages of the respective memory cells are provided with sufficient intervals, and the level sensing speed of the flash memory is increased to improve the performance characteristics of the flash memory. In other words, the present invention provides sufficient intervals between threshold voltage distributions, which become narrower as the number of levels increase, and improves the level sensing speed of the memory by distributing threshold voltages of memory and reference cells properly.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. In a multi-level flash memory including a plurality of flash memory cells having $2^{n+m}$ levels represented by upper n bits and lower m bits wherein n and m are integers greater than 0, a device for programming or reading the flash memory, comprising:
   an upper bit reference cell block for supplying reference cell currents to construct n upper bits in (n+m) bits for representing multi-levels of a selected memory cell;
   a lower bit reference cell block supplying reference currents for constructing m lower bits in the (n+m) bits for representing multi-levels of the selected memory cell; and
   a memory cell program/read unit for reading or programming levels of the selected memory cell by comparing a first voltage of the selected memory cell to the reference currents.

2. The device of claim 1, further comprising:
   a data register for storing an output data of the memory cell program/read unit or supplying the memory cell program/read unit with stored data.

3. The device of claim 1, further comprising:
   a cell gate voltage supplying unit for supplying each control gate of the memory cells with a voltage.

4. The device of claim 1, wherein the upper bit reference cell block includes at least one reference current cell for distinguishing the upper n bits, said reference current cell including a drain current vs. gate voltage characteristic having the same slope as a drain current vs. gate voltage characteristic (Gm=ΔIds/ΔVgs) of the selected memory cell, wherein "Ids" is a drain current and "Vgs" is a control gate voltage.

5. The device of claim 1, wherein the lower bit reference cell block includes a reference current cell for distinguishing the lower m bits, said reference current cell including a drain current vs. gate voltage characteristic having a slope lower than that of a drain current vs. gate voltage characteristic (Gm=ΔIds/ΔVgs) of the selected memory cell, wherein "Ids" and "Vgs" are a drain current and a control gate voltage, respectively.

6. The device of claim 1, wherein the first voltage of the selected memory cell is a drain voltage of the selected memory cell.

7. A circuit for programming a memory including a plurality of memory cells having $2^{n+m}$ levels represented by upper n bits and lower m bits wherein n and m are integers greater than 0, the circuit comprising:
   an upper bit reference cell block for supplying reference cell currents to construct n upper bits in (n+m) bits for representing multi-levels of a selected memory cell;
   a lower bit reference cell block supplying reference currents for constructing m lower bits in the (n+m) bits for representing multi-levels of the selected memory cell; and
   a memory cell program/read unit for programming levels of the selected memory cell by comparing a first voltage of the selected memory cell to the reference currents.

8. The circuit of claim 7, further comprising:
   a data register for supplying the memory cell program/read unit with stored data; and
   a cell gate voltage supplying unit for supplying each control gate of the memory cells with a voltage.

9. The circuit of claim 7, wherein the upper bit reference cell block includes at least one reference current cell for distinguishing the upper n bits, said reference current cell including a drain current vs. gate voltage characteristic having the same slope as a drain current vs. gate voltage characteristic (Gm=ΔIds/ΔVgs) of the selected memory cell, wherein "Ids" is a drain current and "Vgs" is a control gate voltage.

10. The circuit of claim 7, wherein the lower bit reference cell block includes a reference current cell for distinguishing the lower m bits, said reference current cell including a drain current vs. gate voltage characteristic having a slope lower than that of a drain current vs. gate voltage characteristic (Gm=ΔIds/ΔVgs) of the selected memory cell, wherein "Ids" and "Vgs" are a drain current and a control gate voltage, respectively.

11. A circuit for reading a memory including a plurality of memory cells having $2^{n+m}$ levels represented by upper n bits and lower m bits wherein n and m are integers greater than 0, the circuit comprising:

an upper bit reference cell block for supplying reference cell currents to construct n upper bits in (n+m) bits for representing multi-levels of a selected memory cell;

a lower bit reference cell block supplying reference currents for constructing m lower bits in the (n+m) bits for representing multi-levels of the selected memory cell; and a memory cell program/read unit for reading levels of the selected memory cell by comparing a first voltage of the selected memory cell to the reference currents.

12. The circuit of claim 11, further comprising:

a data register for storing an output data of the memory cell program/read unit; and a cell gate voltage supplying unit for supplying each control gate of the memory cells with a voltage.

13. The circuit of claim 11 wherein the upper bit reference cell block includes at least one reference current cell for distinguishing the upper n bits, said reference current cell including a drain current vs. gate voltage characteristic having the same slope as a drain current vs. gate voltage characteristic (Gm=$\Delta$Ids/$\Delta$Vgs) of the selected memory cell, wherein "Ids" is a drain current and "Vgs" is a control gate voltage.

14. The circuit of claim 11, wherein the lower bit reference cell block includes a reference current cell for distinguishing the lower m bits, said reference current cell including a drain current vs. gate voltage characteristic having a slope lower than that of a drain current vs. gate voltage characteristic (Gm=$\Delta$Ids/$\Delta$Vgs) of the selected memory cell, wherein "Ids" and "Vgs" are a drain current and a control gate voltage, respectively.

15. In a memory including a plurality of memory cells having $2^{n+m}$ levels represented by upper n bits and lower m bits wherein n and m are integers greater than 0, a method of programming or reading the memory, the method comprising the steps of:

programming reference currents so as to supply ($2^n-1$) first reference current cells with threshold voltages having predetermined intervals, wherein the first reference current cells distinguish the upper n bits;

programming reference currents so as to supply $2^n$ second reference current cells with threshold voltages having predetermined intervals, wherein the second reference current cells distinguish the lower m bits;

programming a threshold voltage of a selected memory cell to be allocated to one of $2^{n+m}$ threshold voltages; and comparing a first signal of the selected memory cell with the reference currents.

16. The method of claim 15, wherein the comparing step includes:

sensing the upper n bits through one step using comparison circuits that compare currents from the first reference current cells to the first signal of the selected memory cell and storing the sensed upper n bits in a data register; and sensing the lower m bits by varying a voltage applied to a control gate of the selected memory cell through ($2^m-1$) steps using comparison circuits that compare currents from the second reference current cells to the first signal of the selected memory cell and storing the sensed lower m bits in the data register.

17. The method of claim 16, wherein the steps of sensing the upper and lower bits are carried out simultaneously by upper and lower bit read circuits.

18. The method of claim 16, wherein the steps of sensing the upper and lower bits are carried out step by step by sharing upper and lower bit read circuits in common.

19. The method of claim 15, wherein the first signal is a drain current of the selected memory cell.

20. The method of claim 15, wherein locations of the $2^{n+m}$ threshold voltages of the selected memory cell are divided into $2^n$ groups and programmed such that threshold voltages of the first reference current cells are located between the respective groups, and wherein respective groups having $2^m$ threshold voltages are sensed by the second reference current cells.

21. The method of claim 18, wherein ($2^m-1$) voltages are applied to a control gate of the selected memory cell so that the respective groups are sensed simultaneously by adjusting a slope of a characteristic graph of lower bit reference currents supplied from the second reference current cells.

* * * * *